United States Patent [19]

Sawa et al.

[11] Patent Number: 4,500,851
[45] Date of Patent: Feb. 19, 1985

[54] PLURAL PHASE LOCK LOOP SIGNAL REGENERATION CIRCUIT

[75] Inventors: Buntaro Sawa, Sagamihara; Naoto Honda, Hino, both of Japan

[73] Assignee: Tokyo Shibaura Denki Kabushiki Kaisha, Japan

[21] Appl. No.: 452,100

[22] Filed: Dec. 22, 1982

[30] Foreign Application Priority Data

Dec. 23, 1981 [JP] Japan ................................ 56-206974

[51] Int. Cl.$^3$ ............................................. H03L 7/00
[52] U.S. Cl. .......................................... 331/2; 331/25; 331/47
[58] Field of Search .......................... 331/2, 23, 25, 47

[56] References Cited

U.S. PATENT DOCUMENTS 4,459,560  7/1984  Kurihara .............................. 331/2

FOREIGN PATENT DOCUMENTS 0053927  4/1980  Japan ..................................... 331/2
839422   6/1960  United Kingdom .
2084415  4/1982  United Kingdom .................. 331/17

OTHER PUBLICATIONS

30th Annual Conference of the IEEE Vehicular Technology Society, Session E-2, New Land Mobile Equipment and Systems, "Overview of an AMPS Mobile Call Processing System".

Primary Examiner—Eugene R. Laroche
Assistant Examiner—Robert J. Pascal
Attorney, Agent, or Firm—Finnegan, Henderson, Farabow, Garrett & Dunner

[57] ABSTRACT

A signal regeneration circuit using first and second phase-locked loop (PLL) circuits each having a phase comparator, a loop filter and a voltage controlled oscillator (VCO) in which the phase of an input signal is shifted by a desired amount. The first PLL operates as an input signal frequency averaging means, and the second PLL operates to satisfy the final performance as a signal regenerative circuit based on the output of the VCO in the first PLL, thereby producing as a regenerative signal the output of the VCO in the second PLL. Thus, this signal regeneration circuit can regenerate a clear signal having no noise from an unclear input signal deeply immersed in noise.

4 Claims, 12 Drawing Figures

PLURAL PHASE LOCK LOOP SIGNAL REGENERATION CIRCUIT

BACKGROUND OF THE INVENTION

1. Field of the Invention

This invention relates to a signal regeneration circuit which is used to regenerate an extremely weak original signal deeply immersed in noise.

2. Description of the Prior Art

A typical conventional signal regeneration circuit of this type has employed a phase-locked loop (referred to as a PLL). This PLL has necessitated the following two requirements, since the PLL should consider for the case that an original signal to be regenerated is likely to be modulated by noise and has more than two types of frequencies so that the original signal is included as a whole wide frequency band.

Firstly, since noise is superposed on the original signal and the original signal including a number of jitters should be processed, the loop band-width of the loop filter should be narrowed to be able to reduce the influence of the noise. Secondly, the pull-in range of the PLL should be sufficiently wide so as to be able to pull in the frequency even if the original signal is transferred from one frequency to other frequencies.

Concerning the first requirement, the reduction in the loop band-width can be solved by increasing the time constant of the loop filter of the PLL. Further, the increase in the pull-in range of the PLL of the second requirement is ordinarily solved by employing an edge trigger type phase frequency comparator (referred to as a PFC) for the phase comparator. Since this PFC can increase the pull-in range up to the lock-in range, the entire PLL can attain sufficiently wide pull-in range even if the loop band-width of the PLL is set to narrow width.

Figure 1:
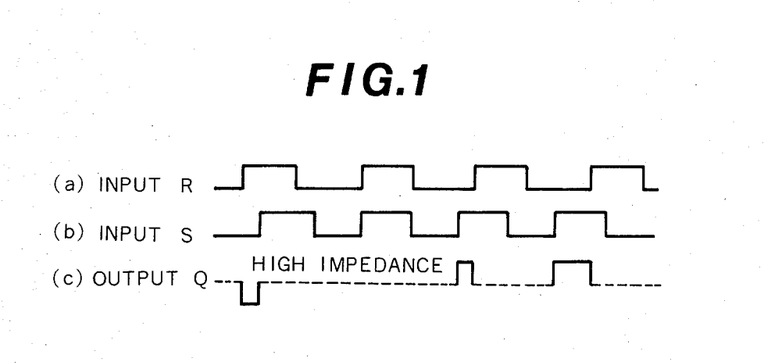
FIGS. 1, 2, and 3 are timing diagram showing the input versus output signal characteristics of the PFC.

The PFC serves, as shown in (a) to (c) of FIG. 1, to detect the phase difference between two input signals R and S and to produce as an output signal Q having logic level "HIGH" and "LOW" pulses whose width is proportional to the phase difference, and operates to set the output signal Q to "HIGH IMPEDANCE" (the state that is neither logic level "HIGH" nor logic level "LOW") during a period of time in which these two inputs R and S are in phase. For example, when the phase of the input signal R leads, the output signal Q becomes "LOW" at the rise of the input signal R, and the output signal Q becomes "HIGH IMPEDANCE" at the rise of the input signal S. When the phase of the input signal R, on the other hand, lags, the output Q becomes "HIGH" at the rise of the input signal S, and the output signal Q becomes "HIGH IMPEDANCE" at the rise of the input signal R.

Figure 2:
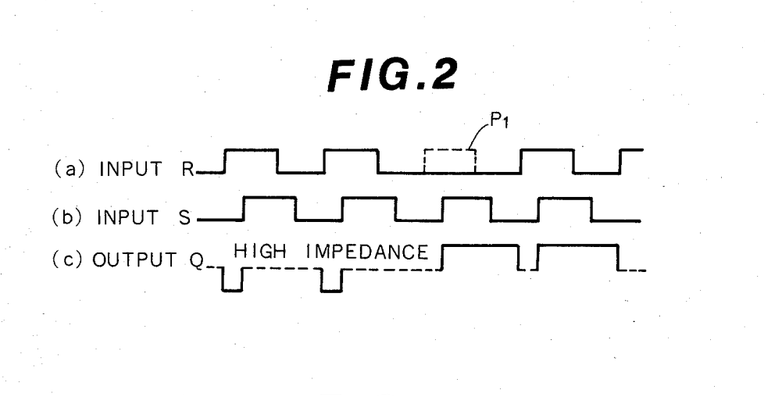

Accordingly, if the input signal to the PFC lacks one or more pulses or includes excessive pulse or pulses, the PFC might invert the output signal Q immediately after the pulse irregularity of the input signal. In other words, if the input signal R lacks, as shown in (a) of FIG. 2, a pulse $P_1$, the PFC operates in the same manner as the phase of the input signal R lags with respect to the phase of the input signal S (refer to (b) of FIG. 2), and as a result the output signal Q unfavorably becomes "HIGH" instead of becoming "LOW" (refer to (c) of FIG. 2). The output signal Q thus varied is applied to a voltage controlled oscillator (referred to as a VCO) through a loop filter. Since the VCO judges such an abrupt change in the output signal Q as a rapid change in the control voltage, the VCO regards the entire loop of the PLL as in a lock-out state, and operates to correct to hold in range.

Figure 3:
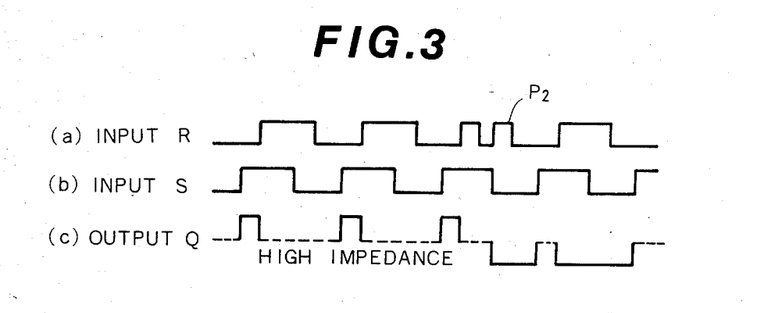

If the input signal R includes an excessive pulse $P_2$ as shown in (a) of FIG. 3, the PFC operates in the same manner as the phase of the input signal R leads with respect to the phase of the input signal S (refer to (b) of FIG. 3), and as a result the output signal Q unfavorably becomes "LOW" instead of becoming "HIGH" (refer to (c) of FIG. 3). In this case, the VCO judges such an output signal Q thus varied abruptly as a rapid change in the control voltage, and accordingly regards the entire loop of the PLL as in a lock-out state, and operates to correct to hold in range.

The signal which lacks one or more pulses or includes an excessive pulse or pulses due to a chattering, etc. as described above can be frequently observed in a signal deeply immersed in an ordinary noise. However, if such a signal is inputted to a PLL, the PLL should frequently correct to hold in range as described above. As a result, the PLL cannot maintain the lock-in range in operation.

SUMMARY OF THE INVENTION

Accordingly, an object of this invention is to provide a signal regeneration circuit which can eliminate the aforementioned drawbacks and disadvantages of the conventional signal regeneration circuit and which is capable of regenerating a clear signal having no noise from an unclear input signal deeply immersed in a noise and thus unknown in any state.

A signal regeneration circuit according to this invention is constructed to comprise a first PLL which operates as an input signal frequency averaging means, and a second PLL which operates to satisfy the requirements as a signal regenerative circuit based on the output of a VCO in the first PLL, thereby producing the output of the VCO in the second PLL as a regenerative signal. Therefore, the first PLL employs as its phase comparator an exclusive OR circuit type or a flip-flop circuit type which serves to detect the phase difference between the input signal and the output of the VCO in the first PLL and to produce a pulse of one polarity corresponding to the phase difference, and attains a sufficient pull-in range to set a wide loop band-width capable of avoiding the influence of the temporary phase error between the input signal and the output of the VCO in the first PLL. Further, the second PLL is arranged to have narrow loop band-width so as to attenuate a noise superposed on the input signal and the PFC capable of providing the PLL with sufficiently wide pull-in range when the narrow loop band-width in comparison with that of the first PLL is set in the second PLL is employed as a phase comparator which receives the output of the VCO of the first PLL and the output of the VCO of the second PLL as comparison signals.

In this manner, the first PLL can produce a signal which becomes a pulse train that is corrected from the signal which lacks a pulse or includes an excessive pulse even if the signal includes a noise or a jitter (i.e., the frequency is averaged), and the second PLL which again pulls in the signal thus corrected as this pulse train, can produce a clear pulse signal which is stabilized in frequency and is excluded from the noise and the jitter.

Further, since the first PLL is set to a wide loop band-width which can attain sufficient pull-in range, the PLL can pull in the input signal over a wide frequency range and can stably lock in range. Further, since the second PLL is constructed to pull in the pulse train stabilized by the first PLL, the PLL can stably maintain the lock-in range. In other words, according to the signal regeneration circuit of the present invention, a clear pulse signal can be regenerated stably over a wide frequency range.

An embodiment of the invention will now be described in detail with reference to the attached drawings.

DESCRIPTION OF THE PREFERRED EMBODIMENTS

Figure 4:
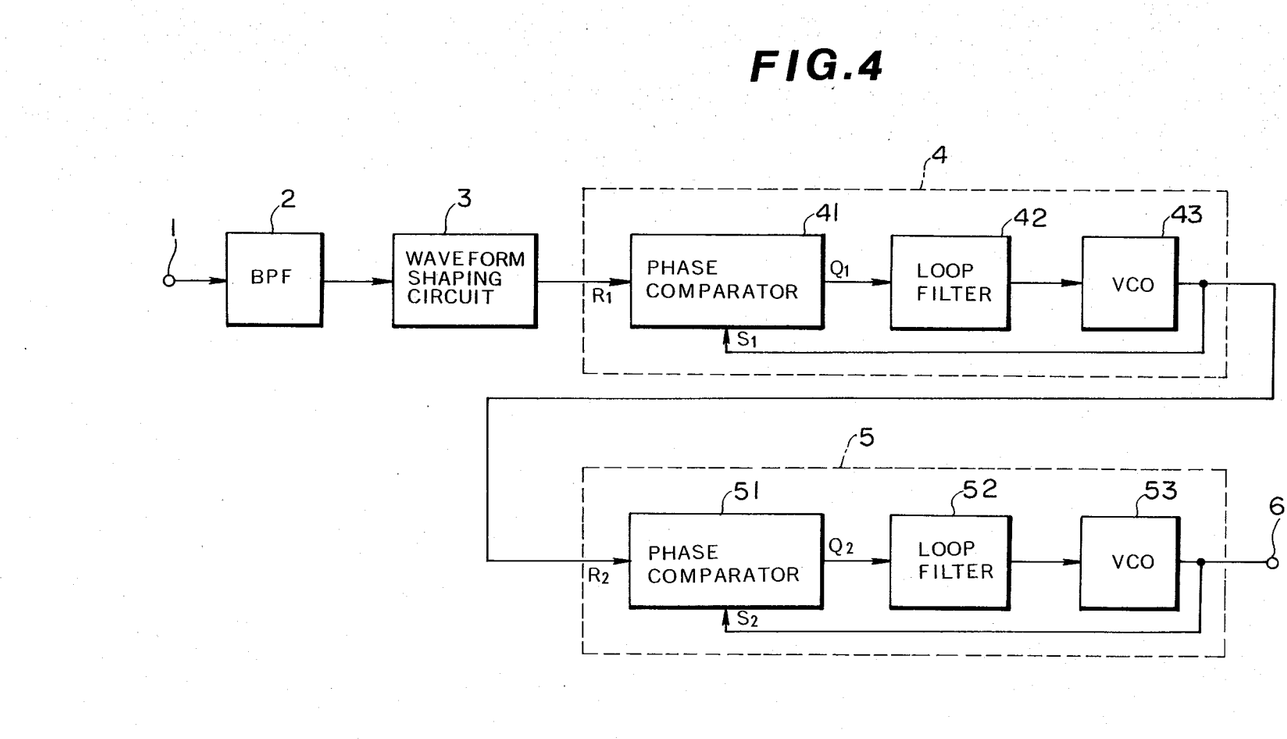
FIG. 4 is a block diagram showing an embodiment of a signal regeneration circuit according to the present invention.

FIG. 4 shows one preferred embodiment of a signal regeneration circuit according to the present invention.

In FIG. 4, reference numeral 1 designates an input terminal, to which a signal deeply immersed in a noise is inputted. The signal inputted from the input terminal 1 is in turn inputted to a band pass filter (referred to as a BPF) 2, and is arranged to be a signal having only frequency components which are near to those of an original signal by means of the BPF. The output signal from the BPF is further inputted to a waveform shaping circuit 3, and is waveform-shaped to be a logic level signal of a first PLL 4.

This signal is then inputted to the first PLL 4. The output signal of the first PLL 4 becomes an input signal of a second PLL 5. The output signal of the second PLL 5 is outputted from an output terminal 6.

The first PLL 4 has a phase comparator 41, a loop filter 42 and a VCO 43. The signal outputted from the waveform shaping circuit 3 is applied to an input R1 of the phase comparator 41, is further applied through the loop filter 42 and the VCO 43, and is sequentially outputted to the second PLL 5. The output signal of the VCO 43 is fed back to the other input S1 of the phase comparator 41. The phase comparator 41 employs the type for outputting a pulse of one polarity corresponding to the phase difference between the two input signals R1 and S1. The phase comparator of this type includes various outputs such as a so-called "sawtooth wave characteristic" and a "triangular wave characteristic", etc. As an example, the input versus output characteristics of a phase comparator for producing a "triangular wave characteristic" employing an exclusive OR circuit are shown in FIGS. 5 and 6.

Figure 5:
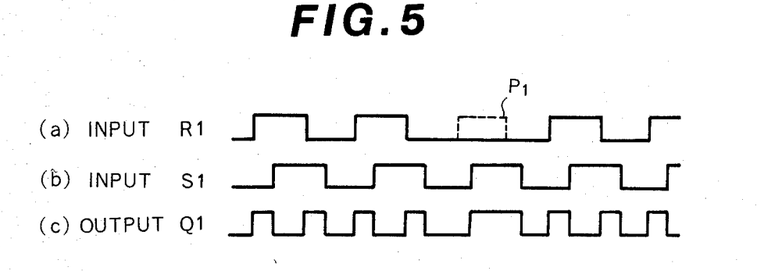
FIGS. 5 and 6 are timecharts showing the input versus output signal characteristics of a phase comparator using an exclusive OR circuit.
Figure 6:
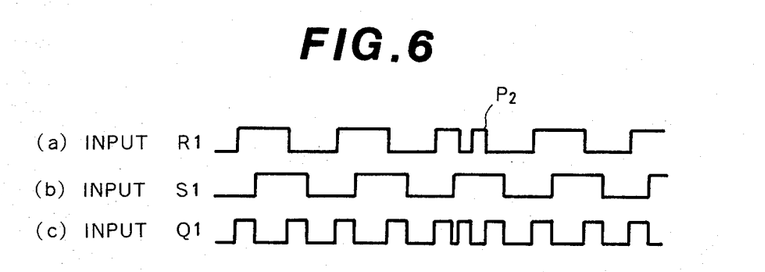

Referring to (a) to (c) of FIG. 5 and (a) to (c) of FIG. 6, the output signals Q1 of the phase comparator vary is shown in the drawings as depending upon the phase differences between the input signals R1 and S1 applied to the phase comparator 41. More particularly, when both the input signals R1 and S1 are logic level "HIGH" or "LOW", the output signal Q1 becomes logic level "LOW", and only when the input signals R1 and S1 become different logic levels, the output signal Q1 becomes logic level "HIGH". Accordingly, even if the input signal R1 lacks a pulse $P_1$ as shown in (a) of FIG. 5, or even if the input signal R1 includes an excessive pulse $P_2$ as shown in (a) of FIG. 6, the output signal Q1 is temporarily affected thereby, but does not produce a large variation in the output level as shown in the case of the PFC in FIGS. 2 and 3.

On the other hand, the loop filter 42 is assumed to have a time constant which can attain the sufficient pull-in range by increasing the loop band-width of the PLL 4.

The second PLL 5 has a phase comparator 51, a loop filter 52 and a VCO 53. The output signal of the first PLL 4 (i.e., the output signal of the VCO 4) is inputted as an input signal R2 to the phase comparator 51, is fed through the phase comparator 51 to the loop filter 52, and is further outputted from the VCO 53. The output signal from the VCO 53 is fed back to the other input S2 of the phase comparator 51.

The loop filter 52 is constructed to have a time constant which narrows the loop band-width of the PLL 5, and the phase comparator 51 is constructed to have a PFC having the input versus output characteristics shown in FIG. 1 so as to attain the wide pull-in range even if the loop band-width is narrowed in this manner.

The operation of the embodiment of the signal regeneration circuit thus constructed will now be described.

Figure 7:
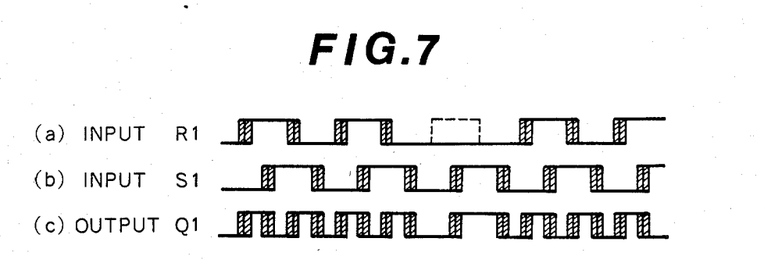
FIGS. 7 and 8 are timecharts illustrating examples of the operation of the signal regeneration circuit according to the present invention.

Assume that an input signal which has a number of jitters and lacks one or more pulses is inputted to the input terminal 1, the signal is so arranged through the BPF 2 so that its frequency components are similar to the original signal, is then waveform-shaped through the waveform shaping circuit 3, and is, for example, inputted to the first PLL 4 in the form of the waveform shown in (a) of FIG. 7.

Figure 8:
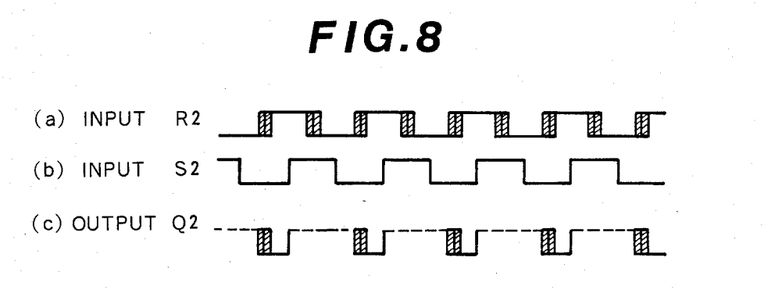

As described above, since a phase comparator of exclusive OR type which operates, for example, as shown in FIGS. 5 and 6, is used as the phase comparator 41 of the first PLL 4 and the loop band-width of the first PLL 4 is selected widely, the output signal of the first PLL and hence the output of the VCO 43 has a number of jitters, but is locked to the input R1 (more accurately, to the average frequency of the input signal R1) of the phase comparator 41, and thus becomes a signal which lacks no pulse as shown in (b) of FIG. 7. This output becomes an input R2 of the phase comparator 51 of the second PLL 5 (refer to (a) of FIG. 8).

Since the loop band-width of the second PLL 5 is selected of sufficiently narrow width and the phase comparator 51 employs a PFC, the output of the PLL 5 and hence the output of the VCO 53 (also becoming the other input S2 of the phase comparator 51) is effectively locked to the average frequency (i.e., the frequency of the original signal) of the input R2 of the phase comparator 51, and becomes a signal which has almost no jitter, and is outputted from the output terminal 6.

The above mentioned operation of the embodiment of the signal regeneration circuit thus constructed is fundamentally similar to that when an input signal having an excessive pulse is applied to the input terminal 1, and a clear signal which is corrected from the excessive pulse can be outputted from the output terminal 6.

In the embodiment described above, if the frequency of the input signal falls within the predetermined frequency band width capable of being pulled in the first PLL 4, the similar effect to the above PLL can be obtained even if the BPF 2 is omitted. If the input signal level is a predetermined level corresponding to the logic level of the phase comparator 41, the similar effect to the above PLL can be obtained even if the waveform shaping circuit 3 is omitted. If the frequency of the input signal falls further within the predetermined frequency band width capable of being pulled in by the first PLL 4 and the level is a predetermined level corresponding to the logic level of the phase comparator 41, the similar effect to the PLL can also be obtained even if the PBF 2 and the waveform shaping circuit 3 are omitted.

Examples of designing the above-described circuit will be shown so as to prove the effect with numeral values. In this case, the assumption will be placed as in the following fundamental items:

(1) The first PLL 4 receives an input signal through the BPF 2, and the band width of the BPF 2 is represented by Bi.

(2) The phase comparator 41 employs an exclusive OR circuit type, and the input/output waveforms are approximated to a sinusoidal waveform.

Figure 9:
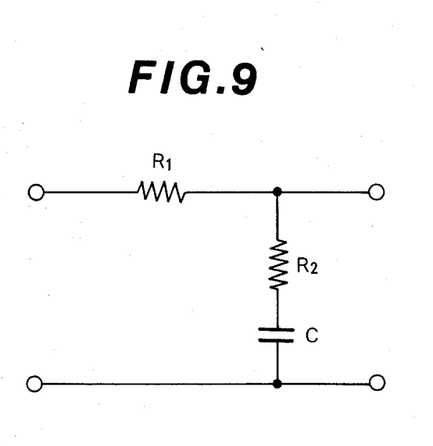
FIGS. 9 and 10 are circuit diagrams of a lag-lead filter used in the signal regeneration circuit.

(3) The loop filters 42 and 52 are lag-lead type filters as shown in FIG. 9.

The fundamental equations for designing the PLL are initially given. However, the constants of the lag-lead filter shown in FIG. 9 are defined as follows:

$$\tau_1 = R_1 \cdot C$$

$$\tau_2 = R_2 \cdot C$$

The transfer function H(s) of the PLL is $$H(s) = \frac{K_0 \cdot K_d(s \cdot \tau_2 + 1)/(\tau_1 + \tau_2)}{s^2 + s(1 + K_0 \cdot K_d \cdot \tau_2)/(\tau_1 + \tau_2) + K_0 \cdot K_d/(\tau_1 + \tau_2)}$$

where $K_d$ represents the sensitivity of the phase comparator, and the $K_0$ represents the sensitivity of the VCO. This equation will be rewritten by preparing coefficients so that the denominator becomes $(s^2 + 2\xi \cdot \omega_n s + \omega_n^2)$ as follows:

$$H(s) = \frac{s \cdot \omega_n (2\zeta - \omega_n/K_0/K_d) + \omega_n^2}{s^2 + 2\zeta \cdot \omega_n \cdot s + \omega_n^2}$$

where $$\omega_n = \sqrt{K_0 \cdot K_d/(\tau_1 + \tau_2)} \quad (1)$$

$$\zeta = \frac{1}{2} \omega_n \left( \tau_2 + \frac{1}{K_0 \cdot K_d} \right) \quad (2)$$

$\omega_n$ and $\xi$ are respectively called a natural angular frequency and a damping factor.

Then, equations for obtaining a loop noise band width and a phase jitter component will be given.

The loop noise band width $B_L$ is defined by the following equation:

$$B_L = \int_0^\infty |H(j\omega)|^2 \, df = \frac{\omega_n}{2}\left(\zeta + \frac{1}{4\zeta}\right) \quad (3)$$

where the relationship of $(\omega_n/K_0 \cdot K_d) << 2\xi$ should exist.

The signal-to-noise ratio S/N of the input signal through the BPF 2 of the band width Bi can be obtained by the following equation:

$$S/N = \frac{A}{N_0 \cdot Bi} \quad (4)$$

where the noise electric power per 1 Hz of frequency is represented by $N_o$ and the signal electric power is represented by A. Further, the variance $\rho_\phi$ of the phase jitter component through the PLL can be represented by the following equation:

$$\rho_\phi = N_o \cdot B_L / A \quad (5)$$

Therefore, the effective value $\phi$ of the phase jitter becomes the following equation:

$$\phi = \sqrt{N_0 \cdot B_L / A} \quad (6)$$

It is understood from the equation (6) that, the smaller the loop noise band width $B_L$ of the PLL is, the lower the phase jitter component becomes. The equation (6) can be reformed as follows:

$$B_L = (\phi^2 \cdot A) N_o \quad (7)$$

Then, an equation for obtaining the pull-in range of the PLL will be given.

The pull-in range $\omega_P$ of the PLL of the case that the sinusoidal waveform phase comparator is used for the phase comparator and that the lag-lead filter is used for the loop filter as assumed previously can be represented by the following equation:

$$\omega_P = \frac{K_0 \cdot K_d}{m} \sqrt{2m - m^2} \quad (8)$$

where the constant m is defined as follows:

$$m = \tau_2/(\tau_1 + \tau_2)$$

The circuit exemplified in FIG. 4 will be designed based on the above respective equations. As one example, the designing conditions are determined as follows:

(1) The frequency of the input signal is 6,000 Hz.

(2) The band width Bi of the BPF 2 is 1,200 Hz.

(3) The pull-in range $\omega_P$ (which is determined by the first PLL in this embodiment) is ±500 Hz.

(4) The maximum value of the phase jitter in the final output (i.e., the output of the second PLL) is ±20° under the condition that the signal-to-noise ratio S/N of the input signal is S/N = 10 dB.

(Design of First PLL 4)

Initially, the constants $\tau_1$, $\tau_2$, the natural angular frequency $\omega_n$ and the loop noise band width $B_L$ of the loop filter will be obtained from the pull-in range $\omega_P$.

Firstly, the pull-in range $\omega_P = 2\pi \times 500$(rad), the sensitivity $K_0 = 2\pi \times 500$ of the VCO 43, and the sensitivity $K_d=1$ of the phase comparator 41 are substituted in the above equation (8), and the value of the m will be obtained as follows:

$$2\pi \times 500 = \frac{2\pi \times 250}{m} \sqrt{2m - m^2}$$

$$2m = \sqrt{2m - m^2}$$

$$5m^2 - 2m = 0$$

$$m = 0, \frac{2}{5}$$

Secondly, assuming that the damping factor $\xi=0.7$, and the filter constants $(\tau_1+\tau_2)$ of the loop filter 42 will be obtained as follows: That is, the $\tau_2$ in the above equation (2) is substituted for the following:

$$\tau_2 = m(\tau_1 + \tau_2),$$

then, $$\zeta = \frac{1}{2} \omega_n \left\{ m(\tau_1 + \tau_2) + \frac{1}{K_0 \cdot K_d} \right\}$$

$$\zeta = \frac{1}{2} \sqrt{\frac{K_0 \cdot K_d}{\tau_1 + \tau_2}} \left\{ m(\tau_1 + \tau_2) + \frac{1}{K_0 \cdot K_d} \right\}$$

$$= \frac{1}{2} m \sqrt{K_0 \cdot K_d} \sqrt{\tau_1 + \tau_2} + \frac{1}{2\sqrt{K_0 \cdot K_d} \sqrt{\tau_1 + \tau_2}}$$

A variable x is here defined as $x=\sqrt{\tau_1+\tau_2}$, then, $$\zeta = \frac{1}{2} m \sqrt{K_0 \cdot K_d} \cdot x + \frac{1}{2\sqrt{K_0 \cdot K_d} \cdot x}$$

$$m \cdot K_0 \cdot K_d \cdot x^2 - 2\sqrt{K_0 \cdot K_d} \cdot \zeta \cdot x + 1 = 0$$

$$x = \frac{2\sqrt{K_0 \cdot K_d} \cdot \zeta \pm \sqrt{4 K_0 \cdot K_d \cdot \zeta^2 - 4m \cdot K_0 \cdot K_d}}{2m \cdot K_0 \cdot K_d}$$

Now, $\zeta = 0.7$, $m = \frac{2}{5}$, and $K_0 K_d = 2\pi \times 250$ are substituted in the above equation to obtain the value of x as follows:

$$x = \frac{2\sqrt{2\pi \times 250} \times 0.7}{2 \times \frac{2}{5} \times 2\pi \times 250} \pm$$

$$\frac{\sqrt{4 \times 2\pi \times 250 \times 0.7^2 - 4 \times \frac{2}{5} \times 2\pi \times 250}}{2 \times \frac{2}{5} \times 2\pi \times 250}$$

$$= 6.31 \times 10^{-2}$$

Since there is a relationship of $\tau_1+\tau_2=x^2$, $$\tau_1 + \tau_2 = x = (6.31 \times 10^{-2})^2 = 3.98 \times 10^{-3}$$

Since the filter constant $\tau_2$ is $\tau_2=m(\tau_1+\tau_2)$, the $\tau_2$ becomes as follows:

$$\tau_2 = \frac{2}{5} \times 3.98 \times 10^{-3}$$

$$= 1.59 \times 10^{-3}$$

Then, the natural angular frequency $\omega_n$ will be obtained using the above equation (1). That is, $K_0 \cdot K_d = 2\pi \times 250$, and $\tau_1+\tau_6=3.98\times10^{-3}$ are substituted in the above equation (1), and the natural angular frequency can be obtained as follows:

$$n = \sqrt{\frac{2\pi \times 250}{3.98 \times 10}}$$

$$= 628$$

Therefore, the loop noise band width $B_L$ can be obtained as follows by substituting $\xi=0.7$, and $\omega_n=628$ in the above equation (3):

$$B_L = \frac{628}{2} \left( 0.7 + \frac{1}{4 \times 0.7} \right)$$

$$= 322 \text{ (Hz)}$$

The above results thus obtained can be summarized as follows:

Natural angular frequency: $\omega_n=628$
Damping factor: $\xi=0.7$ $$\text{Filter constants:} \begin{cases} \tau_1 + \tau_2 = 3.98 \times 10^{-3} \\ \tau_2 = 1.59 \times 10^{-3} \end{cases}$$

Loop noise band width: $B_L=332$ (Hz)

Then, the maximum value ($4\phi$) of the phase jitter in the first PLL 4 will be obtained from the value of the loop noise band width $B_L$ obtained as above. That is, the signal-to-noise ratio S/N of the input signal, S/N=10 (dB) and the band width Bi of the BPG 2, Bi=1,200 (Hz) are first substituted in the equation (4) as follows:

$$10 = \frac{A}{N_0 \times 1200}$$

$$\frac{A}{N_0} = 10 \times 1200 = 12000$$

Then, $$\frac{N_0}{A} = \frac{1}{12000},$$

and $B_L=332$ (Hz) are substituted are substituted in the equation (6) as follows:

$$4\phi = 4\sqrt{\frac{1}{12000} \times 332}$$

$$= 0.665 \text{ (rad)}$$

$$= 38.1°$$

In this manner, the maximum value of the phase jitter in the first PLL 4 is ±38.1°.

(Design of Second PLL 5)

In this design, the maximum value of the phase jitter will be suppressed within ±20° as described above.

It is assumed that the maximum value of the phase jitter is afforded to be 18° as follows:

$$4\phi = 18° = 0.314 \text{ (rad)}$$

Therefore, $$\phi = \frac{0.314}{4}$$

This value is substituted in the equation (7), and the loop noise band width $B_L$ of the second PLL 5 will be obtained as follows: In this case, $A/N_0 = 12000$ is given as previously obtained.

$$B_L = \left(\frac{0.314}{1}\right)^2 \times 12000$$

$$= 73.9 \text{ (Hz)}$$

Then, the value of the damping factor $\xi$ is suitably selected, and the natural angular frequency $\omega_n$ in the second PLL 5 will be obtained as follows: Since the phase response error against the variation in the phase step becomes smaller value in a short time when the damping factor $\xi$ is set to larger value, the damping factor $\xi$ is selected to $\xi = 1.4$. First, the equation (3) is modified as follows:

$$\omega_n = \frac{2B_L}{\zeta + \frac{1}{4\zeta}}$$

The $B_L = 73.9$ (Hz), and $\xi = 1.4$ are substituted in the above equation as follows:

$$\omega_n = \frac{2 \times 73.9}{1.4 + \frac{1}{4 \times 1.4}}$$

$$= 93.6$$

Then, with the sensitivity $K_0 = 2\pi \times 250$ of the VCO 53 and the sensitivity $K_d = 0.25$ of the phase comparator 51 (PFC), the filter constant $(\tau_1 + \tau_2)$ of the loop filter 52 will be obtained as follows: First, the equation (1) is modified as follows:

$$\tau_1 + \tau_2 = \frac{K_0 \cdot K_d}{\omega_n^2}$$

The $\omega_n = 93.6$, $K_0 = 2\pi \times 250$, and $K_d = 0.25$ are substituted in the above equation as follows:

$$\tau_1 + \tau_2 = \frac{2\pi \times 250 \times 0.25}{(93.6)^2}$$

$$= 4.48 \times 10^{-2}$$

Further, the filter constant $\tau_2$ can be modified from the equation (2) as follows:

$$\tau_2 = \frac{\zeta - \frac{1}{K_0 \cdot K_d}}{\frac{\omega_n}{2}}$$

Similarly, the $\omega_n = 93.6$, $K_0 = 2\pi \cdot 250$, and $K_d = 0.25$ as well as $\xi = 1.4$ are substituted in the above equation as follows:

$$\tau_2 = \frac{1.4 - \frac{1}{250 \times 0.25}}{\frac{93.6}{2}}$$

$$= 2.99 \times 10^{-2}$$

The above results thus obtained can be summarized as follows:

Natural angular frequency: $\omega_n = 93.6$
Damping factor: $\xi = 1.4$

Filter constants: $\begin{cases} \tau_1 + \tau_2 = 4.48 \times 10^{-2} \\ \tau_2 = 2.99 \times 10^{-2} \end{cases}$ Loop noise band width: $B_L = 73.9$ (Hz)

The final phase jitter characteristics of the signal generation circuit is determined by the respective constants of the second PLL 5.

In order to prove the advantages and the effects of the circuit thus exemplified in the above design, the responsiveness of the first and the second PLLs 4 and 5 will be described in the case that the input signal lacks a pulse.

Initially, the input signal to the VCO 43 of the first PLL 4 in the case that a rectangular signal which lacks no pulse is inputted will be obtained as an ordinary operation.

When the voltages of the respective sections in the lag-lead filter shown in FIG. 9 are first determined as shown in FIG. 9, the filter current i becomes as follows:

$$i = \frac{v_{in} - v_C}{R_1 + R_2} \quad (9)$$

and the filter current i can be expressed as follows:

$$i = C \frac{dv_C}{dt} \quad (10)$$

Further, the output voltage $v_{out}$ of the filter can be expressed as follows:

$$v_{out} = (v_{in} - v_C)\frac{R_2}{R_1 + R_2} + v_C \quad (11)$$

Then, the voltage $v_C$ across the capacitor can be obtained as follows from the equations (9) and (10):

$$\frac{v_{in} - v_C}{R_1 + R_2} = C \frac{dv_C}{dt}$$

-continued
$$C(R_1 + R_2)\frac{dv_C}{dt} + v_C = v_{in}$$

When this differential equation is solved, $v_C$ becomes as follows:

$$v_C = C_1 \cdot e^{-\frac{t}{CR1+CR2}} + v_{in} \quad (12)$$

Figure 11:
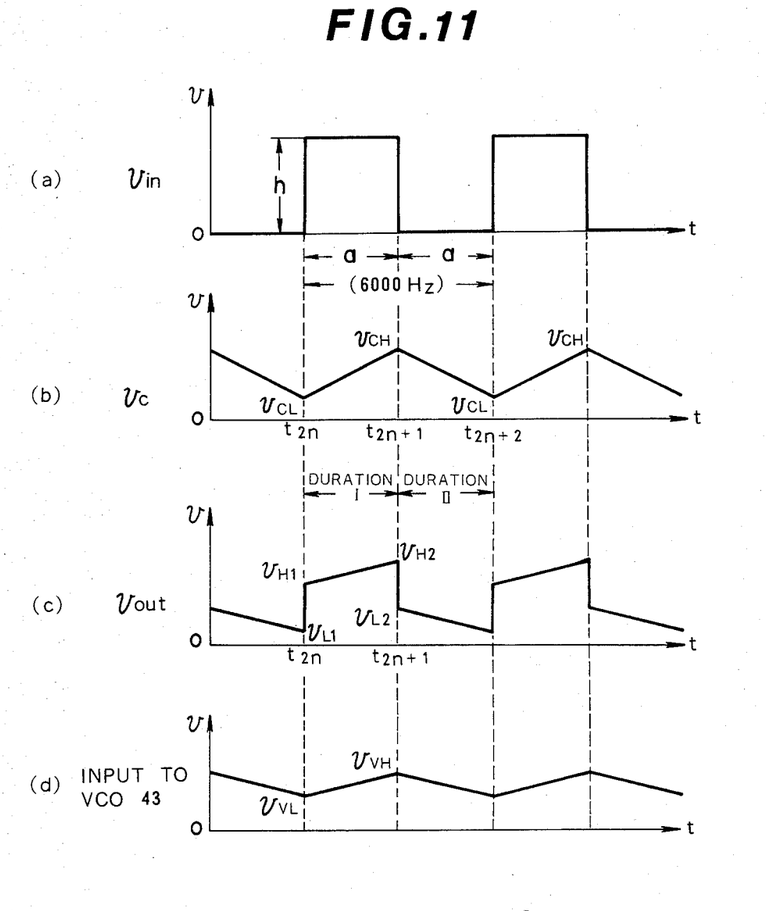
FIGS. 11 and 12 are timecharts showing the operating characteristics of the lag-lead filter shown in FIGS. 9 and 10.

Therefore, when the input signal $v_{in}$ to the above filter is a rectangular wave as shown in (a) of FIG. 11, the stationary value of the voltage $v_C$ becomes as shown in (b) of FIG. 11. Then, the initial values of the duration I in (b) of FIG. 11 are substituted into equation (12) to obtain the coefficient $C_1$ as follows: That is, since $t=t_{2n}$, $v_C=v_{CL}$ and $v_{in}=h$ (refer to (a) of FIG. 11), $v_{CL}$ becomes as follows:

$$V_{CL} = C_1 \cdot e^{-\frac{t_{2n}}{C \cdot R1 + C \cdot R2}} + h$$

Therefore, $C_1$ becomes as follows:

$$C_1 = \frac{v_{CL} - h}{e^{-t_{2n}/(C \cdot R1 + C \cdot R2)}} \quad (13)$$

When this equation (13) is substituted in the above equation (12) and is arranged, this equation becomes as follows, (where $\alpha = 1/(C \cdot R_1 + C \cdot R_2)$):

$$v_C = v_{CL} \cdot e^{-\alpha(t-t_{2n})} + h(1 - e^{-\alpha(t-t_{2n})}) \quad (14)$$

Since $v_C = v_{CH}$ can be obtained in case of $t = t_{2n+1}$ in (b) of FIG. 11, the following equation can be obtained:

$$v_{CH} = v_{CL} \cdot e^{-\alpha(t_{2n+1}-t_{2n})} + h(1 - e^{-\alpha(t_{2n+1}-t_{2n})})$$

When $(t_{2t+1} - t_{2n}) = a$ is defined, $$v_{CH} = v_{CL} \cdot e^{-\alpha a} + h(1 - e^{-\alpha a}) \quad (15)$$

Further, $v_{in} = 0$ (refer to FIG. 11A) can be obtained in case of $t = t_{2n+1}$ in the duration II in (b) of FIG. 11, and accordingly the following equation can be obtained:

$$v_{CH} = C_1 \cdot e^{-\alpha \cdot t_{2n+1}}$$

Accordingly, the coefficient $C_1$ becomes as follows:

$$C_1 = \frac{v_{CH}}{e^{-\alpha \cdot t_{2n+1}}} \quad (16)$$

When this equation (16) is substituted in the above equation (12) and is arranged, the following equation can be obtained:

$$V_C = v_{CH} \cdot e^{-\alpha(t-t_{2n})} \quad (17)$$

Since $v_C = v_{CL}$ can be obtained in case of $t = t_{2n+2}$ in (b) of FIG. 11, the following equation can be obtained:

$$v_{CL} = v_{CH} \cdot e^{-\alpha a} \quad (18)$$

When the $v_{CH}$ is eliminated from the equations (18) and (15), the following equation can be obtained:

$$v_{CL} = \frac{h(1 - e^{-\alpha a}) e^{-\alpha a}}{1 - e^{-2\alpha a}} \quad (19)$$

$$= \frac{h \cdot e^{-\alpha a}}{1 + e^{-\alpha a}}$$

Further, from the relationship of the equation (18), the $v_{CH}$ becomes as follows:

$$v_{CH} = \frac{h}{1 + e^{-\alpha a}} \quad (20)$$

Then, the output voltage of the filter can be obtained from the equations (11), (19) and (20) thus attained as follows:

Since $v_{in} = 0$ and $v_C = v_{CL}$ can be obtained in case of $t = t_{2n} - 0$ (immediately before $t = t_{2n}$) in (a) and (b) of FIG. 11, when they are substituted in the equation (11), the output voltage $v_{out}$ of the filter can be obtained as follows:

$$v_{out} = -v_{CL}\frac{R_2}{R_1 + R_2} + v_{CL} \quad (21)$$

$$= \left(1 - \frac{R_2}{R_1 + R_2}\right) v_{CL}$$

$$= (1 - m)v_{CL}$$

Since the following relationship can be however defined, this is represented by m (refer to the above equation (8)).

$$R_2/(R_1 + R_2) = C \cdot R_2/(C \cdot R_1 + C \cdot R_2) = \tau_2/(\tau_1 + \tau_2)$$

This $v_{out}$ corresponds to the $v_{L1}$ in FIG. 11C. Similarly, since $v_{in} = h$ and $v_C = v_{CL}$ can be attained in case of $t = t_{2n+0}$ (immediately after $t = t_{2n}$) in (a) and (b) of FIG. 11, when they are similarly substituted in the equation (11), the following equation can be obtained:

$$v_{out} = (h - v_{CH})m + v_{CL} \quad (22)$$

$$= mh + (1 - m)v_{CL}$$

This $v_{out}$ corresponds to the $v_{H1}$ in (c) of FIG. 11. Further, since $v_{in} = h$ and $v_C = v_{CH}$ can be attained in case of $t = t_{2n+1} - 0$ (immediately before $t = t_{2n+1}$) in (a) and (b) of FIG. 11, when they are substituted in the equation (11), the following equation can be obtained:

$$v_{out} = (h - v_{CL})m + v_{CH} \quad (23)$$

$$= mh + (1 - m)v_{CH}$$

The $v_{out}$ corresponds to the $v_{CH}$ in (c) of FIG. 11. Since $v_{in} = 0$ and $v_C = v_{CH}$ can be obtained in case of $t = t_{2n+1} + 1$ (immediately after $t = t_{2n+1}$), when they are substituted in the equation (11), the following equation can be obtained:

$$v_{out} = (1 - m)v_{CH} \quad (24)$$

This $v_{out}$ corresponds to the $v_{L2}$ in (c) of FIG. 11.

Since the output voltage $v_{out}$ of the filter is filtered before being inputted to the VCO 43 and the phase comparison frequency components are removed from the output voltage $v_{out}$, the waveform of the signal actually applied to the VCO 43 becomes a waveform as shown in (d) of FIG. 11. However, in (d) of FIG. 11, the lower voltage $v_{VL}$ becomes an averaged value of the $v_{out}$ indicated by the equation (21) and the $v_{out}$ indicated by the equation (22), and the higher voltage $v_{VH}$ becomes an averaged value of the $v_{out}(V_{H2})$ indicated by the equation (23) and the $v_{out}(V_{L2})$ indicated by the equation (24). Accordingly, they can be represented as follows:

$$v_{VL} = \frac{v_{L1} + v_{H1}}{2} \quad (25)$$

$$v_{VH} = \frac{v_{H2} + v_{L2}}{2} \quad (26)$$

Then, when the equations (21) and (22) are substituted in the equation (25), and the equations (23) and (24) are substituted in the equation (26), the following equations can be obtained:

$$v_{VL} = \frac{mh + 2(1-m)v_{CL}}{2} \quad (27)$$

$$v_{VH} = \frac{mh + 2(1-m)v_{CH}}{2} \quad (28)$$

Then, the constants of the first PLL 4 obtained previously are substituted in the above equations (19),(20), and (27), (28), and actual values will be obtained as follows:

The values of a and α in the equations (19) and (20) can be calculated as follows:

$$a = t_{2n+1} - t_{2n} = \frac{1/6000 \text{ (Hz)}}{2} = 8.33 \times 10^{-5}$$

$$\alpha = \frac{1}{\tau_1 + \tau_2} = \frac{1}{3.98 \, 10^{-3}} = 251$$

When the value of the h is 7 (V), the $v_{CL}$ can be obtained from the equation (19) as follows:

$$v_{CL} = \frac{7 \times e^{-(251 \times 833 \times 10^{-5})}}{1 + e^{-(251 \times 833 \times 10^{-5})}}$$

$$= 3.46 \text{ (V)}$$

Then, the $v_{CH}$ can be obtained from the equation (20) as follows:

$$v_{CH} = \frac{7}{1 + e^{-(251 \times 833 \times 10^{-5})}}$$

$$= 3.54 \text{ (V)}$$

Further, since the value of the m in the equations (27) and (28) can be obtained as follows, $$m = \frac{\tau_2}{\tau_1 + \tau_2} = \frac{1.59 \times 10^{-3}}{3.98 \times 10^{-3}} = 0.4$$

the input voltages $v_{VL}$ and $v_{VH}$ of the VCO 43 can be respectively obtained as follows from the equations (27) and (28):

$$v_{VL} = \frac{0.4 \times 7 + 2 \times (1 - 0.4) \times 3.46}{2}$$

$$= 3.48 \text{ (V)}$$

$$v_{VH} = \frac{0.4 \times 7 + 2 \times (1 - 0.4) \times 3.54}{2}$$

$$= 3.52 \text{ (V)}$$

It is thus understood that the input voltages $v_{VL}$ and $v_{VH}$ of the VCO 43 are varied within ±0.02 (V)

Since the modulation sensitivity of the VCO 43 is 500 (Hz/V), the variations in the oscillation frequency of the first PLL 4 with respect to the variations in the input voltages $v_{VL}$ and $v_{VH}$ can be obtained as follows:

$$500 \times (\pm 0.02) = \pm 10 \text{ (Hz)}$$

Further, the lock-in range Δω of the first PLL 4 can be defined as follows:

$$\Delta\omega = 2\xi \cdot \omega_n$$

When $\xi = 0.7$ and $\omega_n = 628$ previously obtained are substituted in the above equation, the following value can be obtained:

$$\Delta\omega = 2 \times 0.7 \times 628$$

$$= 879 \text{ (rad)} = 140 \text{ (Hz)}$$

It can be understood from this that the first PLL can operated without causing out of the lock-in range.

Figure 12:
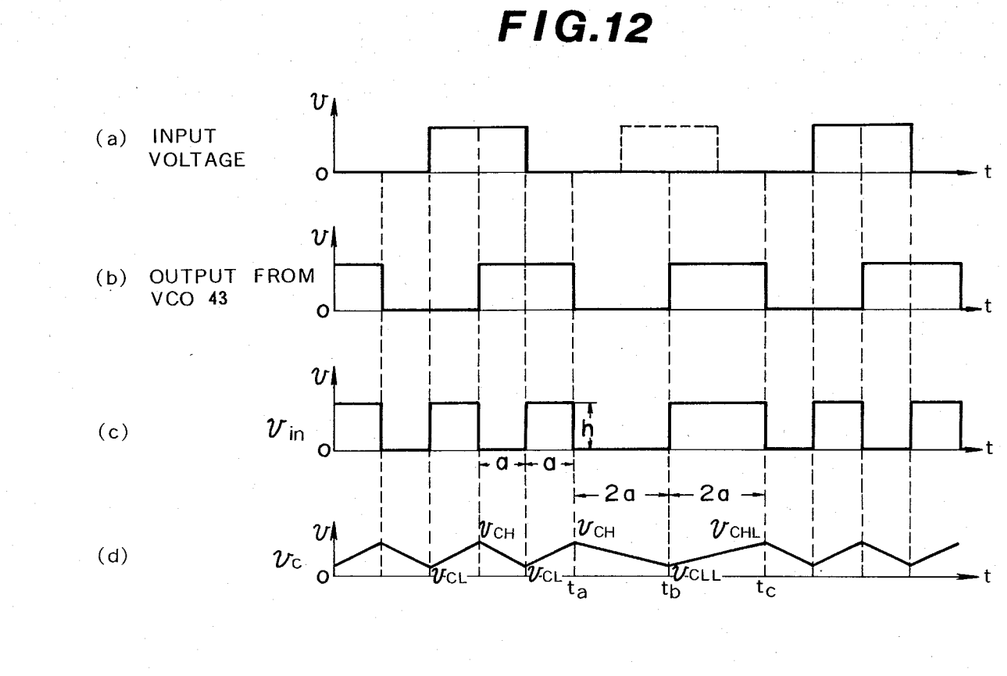

Then, the variation in the oscillation frequency of the first PLL 4 will be obtained in the case that the input voltage to the phase comparator 41 lacks a pulse as shown in (a) FIG. 12.

Figure 10:
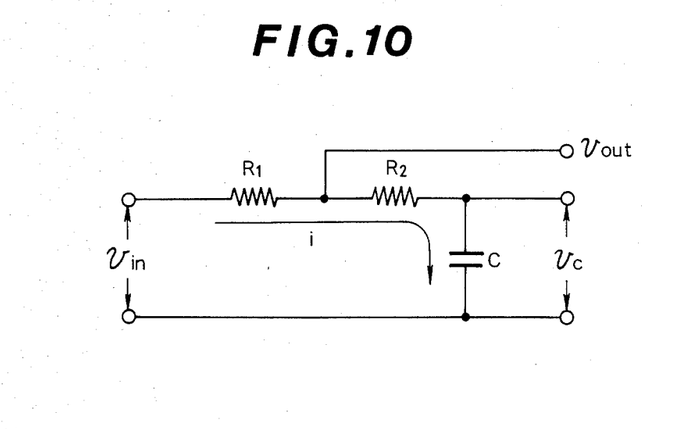

Initially, the voltage $v_C$ across the capacitor in the lag-head filter shown in FIG. 10 will be obtained. However, in this case, the change of the voltage $v_C$ with passage of time when the input voltage lacks a pulse becomes the state shown in (d) of FIG. 12, the coefficient $C_1$ of the differential equation (12) will be obtained, where the voltage $v_C$ at the time $t_{b2}$ in FIG. 12 is represented by $v_{CLL}$ and the voltage $v_C$ at the time $t_C$ in FIG. 12 is represented by $v_{CHL}$ as follows:

In this case, in (d) of FIG. 12, since $v_{in} = 0$ in case of $t = t_a$ to $t_b$ (refer to FIG. 12C) and $v_C = v_{CH}$ in case of $t - t_a$, the following equation can be obtained:

$$v_{CH} = C_1 \cdot e^{-\frac{t_a}{\tau_1 + \tau_2}}$$

Therefore, the coefficient $C_1$ can be obtained as follows:

$$C_1 = \frac{v_{CH}}{e^{-t_a(\tau_1 + \tau_2)}}$$

When this equation is substituted in the equation (12) and is arranged, $$v_C = v_{CH} \cdot e^{-(t - t_a)/(\tau_1 + \tau_2)}$$

Since the $v_C$ is $v_{CLL}$ in case of $t = t_b$ as described above in this case, this is substituted in the above equation, and following equation can be obtained:

$$v_{CLL} = v_{CH} e^{-(t_b - t_a)/(\tau 1 + \tau 2)} \quad (29)$$

$$= v_{CH} \cdot e^{-2a/(\tau 1 + \tau 2)}$$

In (d) of FIG. 12, since $v_{in} = h$ in case of $t = t_b - t_c$ (refer to (c) of FIG. 12) and $v_C = v_{CLL}$ in case of $t = t_b$, the $v_{CLL}$ can be obtained as follows:

$$v_{CLL} = C_1 \cdot e^{-\frac{t_b}{\tau 1 + \tau 2}} + h$$

Therefore, the coefficient $C_1$ can be obtained as follows:

$$C_1 = \frac{v_{CLL} - h}{e^{-t_b/(\tau 1 + \tau 2)}}$$

When this equation is substituted in the equation (12) and is arranged, following equation can be obtained:

$$v_C = (v_{VLL} - h) e^{-(t - t_b)/(\tau 1 + \tau 2)} + h$$

$$= v_{CLL} \cdot e^{-(t - t_b)/(\tau 1 + \tau 2)} + h(1 - e^{-(t - t_b)/(\tau 1 + \tau 2)})$$

Since the $v_C$ is $v_{CHL}$ in case of $t = t_c$ as described above in this case, this is substituted in the above equation, and the following equation can be obtained:

(30)

$$v_{CHL} = v_{CLL} \cdot e^{-(t_c - t_b)/(\tau 1 + \tau 2)} + h(1 - e^{-(t_c - t_b)/(1 + 2)})$$

$$= v_{CLL} \cdot e^{-2a/(\tau 1 + \tau 2)} + h(1 - e^{-2a/(\tau 1 + \tau 2)})$$

From this onward, the equation of the relationship obtained previously in the stationary pulse state can be employed. Accordingly, when the $v_{CL}$ and the $v_{CH}$ are respectively substituted by the $v_{CLL}$ and the $v_{CHL}$ in the above equations (27) and (28), the input voltages $v_{VLL}$ and $v_{VHL}$ to the VCO 43 of this case can be obtained as follows:

$$v_{VLL} = \frac{mh + 2(1 - m)v_{CLL}}{2} \quad (31)$$

$$v_{VHL} = \frac{mh + 2(1 - m)v_{CHL}}{2} \quad (32)$$

Then, actual values will be obtained by substituting the constants of the first PLL 4 in the equations (29), (30) and (31), (32) in the same manner as above. In this case, the constants used in the equations (29) to (32) are as follows:

$v_{CH} = 3.54$ (V)

$a = 8.33 \times 10^{-5}$ $\tau 1 + \tau 2 = 3.98 \times 10^{-3}$ $m = 0.4$ $h = 7$ (V)

From the equation (29), the $v_{CLL}$ can be obtained as follows:

$$v_{CLL} = 3.54 e^{-(2 \times 8.33 \times 10^{-5})/(3.98 \times 10^{-3})}$$

-continued $= 3.40$ (V)

Further, from the equation (30), the $v_{CHL}$ can be obtained as follows:

$$v_{CHL} = 3.40 e^{-(2 \times 8.33 \times 10^{-5})/(3.98 \times 10^{-3})} +$$

$$7 \times (1 - e^{-(2 \times 8.33 \times 10^{-5})/(3.98 \times 10^{-3})})$$

$= 3.55$ (V)

Therefore, the input voltages $v_{VLL}$ and $v_{VHL}$ to the VCO 43 of this case can be obtained from the equations (31) and (32) as follows:

$$v_{VLL} = \frac{0.4 \times 7 + 2 \times (1 - 0.4) \times 3.40}{2}$$

$= 3.44$ (V)

$$v_{VHL} = \frac{0.4 \times 7 + 2 \times (1 - 0.4) \times 3.55}{2}$$

$= 3.53$ (V)

Thus, it is understood that the input voltages $v_{VLL}$ and $v_{VHL}$ of the VCO 43 are varied with $+0.03$ (V) and $-0.06$ (V).

The oscillation frequency of the first PLL 4 of this case is as follows:

$$500 \begin{pmatrix} +0.03 \\ -0.06 \end{pmatrix} = \begin{matrix} +15 \text{ (Hz)} \\ -30 \text{ (Hz)} \end{matrix}$$

This case can sufficiently fall within the range of the lock-in range $\Delta \omega = 140$ (Hz) previously obtained, and the PLL can continue the normal operation without causing out of lock-in range. Accordingly, the output waveform which lacks no pulse as shown in (c) of FIG. 12 can be always obtained from the first PLL 4. Therefore, a stable operation can also be secured even in the second PLL 5 which receives the output of the first PLL 4. The output of the signal regeneration circuit becomes a clear waveform having less jitter with the loop constants of the second PLL 5 as described above.

What is claimed is:

1. A signal regeneration circuit comprising:
    a first phase-locked loop including a first phase comparator serially coupled to a first loop filter and a first voltage controlled oscillator serially coupled to said filter, said first phase-locked loop having a predetermined, wide loop band-width capable of avoiding the influence of any temporary phase error between an input signal and an output signal of said voltage controlled oscillator, said first phase comparator receiving at one input terminal thereof a signal to be regenerated and receiving at a second input terminal thereof said output signal of said voltage controlled oscillator, said first phase comparator detecting a first phase difference between said signal to be regenerated and the output signal of said voltage controlled oscillator to produce a train of pulses each having a width corresponding to said first phase difference; and
    a second phase-locked loop including a second phase comparator serially coupled to a second loop filter and a second voltage controlled oscillator serially coupled to said second filter, said second phase-locked loop having a predetermined, narrow loop bandwidth capable of attenuating noise superposed on said signal to be regenerated, said second phase comparator being a phase frequency comparator receiving at one input terminal thereof the output signal of said first voltage controlled oscillator of said first phase-locked loop and receiving at a second input terminal thereof an output signal from said second voltage controlled oscillator, said second phase comparator detecting a second phase difference between the output signal of said first voltage controlled oscillator and the output signal of said second voltage controlled oscillator to produce a train of pulses whose logic level can be "HIGH" or "LOW" and whose width is proportional to said second phase difference, and to produce a signal whose logic level is neither "HIGH" nor "LOW" during a period when said output signals from said first and second voltage controlled oscillators are in the same phase, whereby the output signal of said second voltage controlled oscillator is a regeneration signal.

2. A signal regeneration circuit as claimed in claim 1, wherein said first phase comparator receives said input signal which is to be regenerated through a band pass filter which filters said input signal so that said input signal is of a predetermined frequency range capable of stably locking said first phase-locked loop.

3. A signal regeneration circuit as claimed in claim 1, wherein said first phase comparator receives said input signal which is to be regenerated through a waveform shaping circuit for converting the level of said input signal into a logic level.

4. A signal regeneration circuit as claimed in claim 1, wherein said first phase comparator receives said input signal which is to be regenerated through a band pass filter for filtering said input signal so as to have a predetermined frequency range capable of stably locking said first phase-locked loop, and through a waveform shaping circuit for converting the level of the filtered output signal of said band pass filter into a logic level.

* * * * *